United States Patent
Castro

(10) Patent No.: US 10,962,577 B2
(45) Date of Patent: Mar. 30, 2021

(54) FREQUENCY STABILITY CONTRIBUTION MEASUREMENT EQUIPMENT

(71) Applicant: Universidade Federal do Rio de Janeiro, Rio de Janeiro (BR)

(72) Inventor: André Ramos de Castro, Rio de Janeiro (BR)

(73) Assignee: UNIVERSIDADE FEDERAL DO RIO DE JANEIRO, Rio de Janeiro (BR)

( * ) Notice: Subject to any disclaimer, the term of this patent is extended or adjusted under 35 U.S.C. 154(b) by 0 days.

(21) Appl. No.: 16/400,446

(22) Filed: May 1, 2019

(65) Prior Publication Data

US 2020/0348345 A1 Nov. 5, 2020

(51) Int. Cl.
| | | |
|---|---|---|
| *G01R 27/28* | (2006.01) | |
| *G01R 23/02* | (2006.01) | |
| *G01R 27/32* | (2006.01) | |
| *G01R 31/28* | (2006.01) | |
| *G01R 23/16* | (2006.01) | |
| *H02J 3/38* | (2006.01) | |
| *G01R 31/30* | (2006.01) | |
| *G01R 35/00* | (2006.01) | |

(52) U.S. Cl.
CPC ............ *G01R 23/02* (2013.01); *G01R 23/16* (2013.01); *G01R 27/28* (2013.01); *G01R 27/32* (2013.01); *G01R 31/2822* (2013.01); *G01R 31/2837* (2013.01); *G01R 31/28* (2013.01); *G01R 31/3004* (2013.01); *G01R 35/00* (2013.01); *H02J 3/382* (2013.01)

(58) Field of Classification Search
CPC .... G01R 27/28; G01R 27/32; G01R 31/2822; G01R 23/16; G01R 31/2837; G01R 31/28; G01R 31/3004; G01R 35/00
USPC ........... 324/76.11–76.83, 459, 612, 615, 638
See application file for complete search history.

(56) References Cited

U.S. PATENT DOCUMENTS

| | | | | |
|---|---|---|---|---|
| 9,478,987 | B2 * | 10/2016 | Nelson | H02J 3/24 |
| 2003/0011348 | A1 * | 1/2003 | Lof | F03D 9/257 322/37 |
| 2004/0124812 | A1 * | 7/2004 | Delmerico | H02J 3/38 322/29 |
| 2009/0279328 | A1 * | 11/2009 | Jiang-Hafner | H02M 7/797 363/35 |
| 2019/0285671 | A1 * | 9/2019 | Ventola | G01R 21/133 |

FOREIGN PATENT DOCUMENTS

| | | |
|---|---|---|
| CN | 103916041 A | 7/2014 |
| CN | 108364449 A | 8/2018 |
| WO | WO2016151014 A1 | 9/2016 |

OTHER PUBLICATIONS

Kundur, et al, "Definition and classification of power system stability IEEE/CIGRE joint task force on stability terms and definitions", Aug. 2004, pp. 1387-1401, vol. 19, No. 3, IEEE Transactions on Power Systems.
Aström, K., Wittenmark, "Computer Controlled Systems: Theory and Design", 1997, Dover Books on Electrical Engineering. 3 ed, New Jersey, NJ, Prentice Hall.
Kundur, P., Balu, N. J., Lauby, M. G. Power system stability and control, v. 7. New York, McGraw-hill New York, 1994.
Ucte, "Appendix 1: Load-Frequency Control and Performance", Jun. 2004.
Miller, NW, et al., "Western Wind Solar Integration Study Phase 3—Frequency Response and Transient Stability", Technical report, National Renewable Energy Laboratory, Golden, CO, 2014.

* cited by examiner

*Primary Examiner* — Raul J Rios Russo
(74) *Attorney, Agent, or Firm* — B. Aaron Schulman, Esq.; Stites & Harbison, PLLC

(57) ABSTRACT

Equipment for measurement of the contribution to frequency stability by a generating unit, especially for generating units based on power electronics. This equipment is to be installed between a generating unit and an electric power system. It emulates an electric power system undergoing a power unbalance, which manifests itself through a grid frequency swing.

3 Claims, No Drawings

FREQUENCY STABILITY CONTRIBUTION MEASUREMENT EQUIPMENT

FIELD OF THE INVENTION

The invention refers to an equipment for measurement of the contribution to frequency stability by a generating unit, especially for generating units based on power electronics.

BACKGROUND OF THE INVENTION

Electric power systems are complex, nonlinear dynamic systems of great dimensions. Although its stability is a characteristic of the whole system, it is helpful to classify events that take them away from stable, viable operating conditions as different kinds of stability issues. One way of classifying stability issues is suggested by KUNDUR, P., PASERBA, J., AJJARAPU, V., et al. "Definition and classification of power system stability IEEE/CIGRE joint task force on stability terms and definitions", IEEE Transactions on Power Systems, v. 19, n. 3, pp. 1387-1401, August 2004. ISSN: 0885-8950. doi: 10.1109/TPWRS.2004. 825981, and shown in FIG. 1. The first level of classification, as rotor angle stability, frequency stability and voltage stability, considers the main system variable through which instability is observed. Further subdivisions may be made with respect to time scales of most relevant processes, analysis techniques and disturbance intensity.

Frequency stability issues may be sustained frequency oscillation, or a frequency deviation with too high an amplitude or rate of change, leading to tripping of system elements. They are basically caused by an inability to recover, without loss of load, from a condition of load-generation unbalance after a disturbance. Examples of such disturbances include tripping of loads or generating units, short circuits, loss of transmission lines and system islanding. This class of system stability is specially relevant in smaller EPS, such as isolated systems, microgrids and islanded systems that broke off from the main EPS due to a protection relay tripping.

Frequency stability can be subdivided in short and long term stability. Relevant processes for short term frequency stability include frequency based protections, either on loads or generators, such as trend relays and Under-Frequency Load Shedding (UFLS), electrical machines inertial responses, primary frequency controls and load-frequency response. These effects range from tens of milliseconds to seconds. Long term aspects of frequency stability may involve processes such as primary and secondary frequency control and protections and controls of boilers or reactors. These effects range from tens of seconds to minutes.

With the prospects of growing renewable energy sources (RES) based generation and distributed generation (DG), concerns over grid frequency stability are also growing. There is great interest in the literature in control strategies that mimic synchronous generators with the purpose of providing inertia to the system and stabilizing grid frequency.

Frequency inertia is related to the dynamics of the state variable that represents the generated voltage's frequency. In a rotating electrical machine, it is highly correlated with the rotating mass' moment of inertia. This rotating mass is composed of the machine's rotor and the turbine that moves it. A converter's control and physical parameters have similar influence in the voltage frequency's dynamics. Control strategies designed to operate with MPPT or constant power (active or reactive) injection are specifically designed to very quickly detect and adapt to grid voltage changes. This is done through fast PLLs, specifically so that even if frequency changes or voltage amplitude changes, injected power does not change.

The amount of kinetic energy stored in an electrical machine's rotor is directly related to its frequency inertia. That is, however, not the case with converters. A voltage source converter can operate for a certain DC link voltage range. The inertia in the sense of amount of energy stored for a given rated voltage level determines the disturbance magnitude required to take the converter out of its stable operation region. Therefore, a big capacitance leads to a sturdy converter, i.e. it has a large amount of stored energy and, more importantly, it requires a large amount of energy flow to take it out of required operating conditions.

These two concepts, frequency inertia and stored energy, are tightly bound in electric machines, but they're not explicitly tightly bound in power electronics converters. The stored energy in a converter is still coupled with its output voltage frequency (if it regulates its own DC link voltage), as a decrease in DC link voltage will cause the converter to transiently change its output voltage amplitude and frequency in order to change active power flow and restore rated DC link voltage. If the front end converter must emulate a synchronous generator, increasing injected power following a frequency drop, then a fast-acting back end converter would help in constituting a sturdy converter, as it would be able to quickly react to changes in stored energy. Therefore, a comprehensive analysis of a converter's capabilities of providing inertia to the grid must take into account the prime mover's dynamics as well, and not only its own inertia. A larger frequency inertia can be emulated as long as we can keep the DC link voltage within operational levels, to which the following characteristics contribute:

the back end converter can quickly respond to the DC link voltage variations (implies dynamic requirements and the capacity of maintaining a power reserve);

high DC link voltage inertia, i.e. amount of stored energy (either higher DC link capacitance and voltage or presence of another ESS)

wide operational range for DC link voltage.

Inertia constants have been taken as an indicator of contribution to grid frequency stability as individual units' inertia constants compose the aggregated inertia constant used in a Load-Frequency Control (LFC) model. When neglecting primary frequency control, a system with aggregated inertia constant Hsys and load damping constant D changes frequency due to generation-load imbalance with a time constant given by $\tau=2H\_sys/D$.

However, one should not compare power electronics based generation's capacity to offer grid frequency support with synchronous machine based generation's considering only their inertia constants. RES and DG have the potential to provide faster primary frequency control, possibly comparable to a synchronous generator's inertial response. The Union for the Coordination of the Transmission of Electricity (UCTE), an association of Transmission System Operators (TSO) for the European interconnected EPS, allows for a maximum deployment time for primary control reserves between 15 and 30 s, depending on the size of the power reserve (UCTE Operation Handbook Appendix 1: Load-Frequency Control and Performance. UCTE, June 2004).

On the other hand, for wind power, the back end converter, which controls electric torque on the generator, may transiently increase extracted power from the turbine, slowing it down, to provide fast response to frequency deviations. This strategy has been called inertial control, being compared with the inertial response provided naturally by synchronous generators, and does not employ a mechanical governor system. The response time provided through this mechanism is therefore faster, depending on electromagnetic dynamics. Wind can also be curtailed, constituting a power reserve, and operated with the typical primary frequency control strategy. The speed of response, in this case, is comparable to hydroelectric machines and mechanical stress limitations may apply. For PV units, there is no rotational inertia and inertial control is therefore not possible. Curtailment, however, is possible and its use for primary frequency control can also achieve faster response times, as shown by MILLER, N., SHAO, M., PAJIC, S., et al. Western Wind and Solar Integration Study Phase 3—Frequency Response and Transient Stability (Report and Executive Summary). Technical report, National Renewable Energy Laboratory (NREL), Golden, Colo., 2014.

In the current scenario, it would be beneficial to be able to measure the quality of grid frequency support provided by a generating unit. For new generation technologies, the inertia constant does not seem to be a clear indication of such a characteristic. Being able to quantify the quality of grid frequency support provided by a generating unit allows for grid codes and utilities to demand good frequency response from RES and DG projects, for clients to compare converters and power generation solutions and for comparison of converter control strategies.

What is needed therefore is an equipment having a back-to-back converter whose grid side controls its DC link voltage, while the generating unit side generates three-phase, rated amplitude voltages whose frequency is given by a Load Frequency Control (LFC) model

SUMMARY OF THE INVENTION

The present invention seeks to provide an equipment for measuring the contribution to frequency stability by a generating unit, with the equipment installed between the generating unit and the electric power system. The equipment emulates the electric power system undergoing a power unbalance, which manifests itself through a grid frequency swing.

The present invention also seeks to provide an equipment for measurement of a contribution to frequency stability by a generating unit with the equipment consisting of a back-to-back converter whose grid side controls its DC link voltage, while the generating unit side generates a three-phase, rated amplitude voltages; whose frequency is given by a Load Frequency Control (LFC) model.

DETAILED DESCRIPTION OF THE INVENTION

The present invention relates to an equipment for measurement of the contribution to frequency stability by a generating unit, especially for generating units based on power electronics. This equipment is to be installed between a generating unit and an electric power system.

Power electronics based generating units, such as new wind turbines and solar photovoltaic plants, are assumed to not contribute to grid frequency stability due to their lack of a physical, rotating inertia, like the rotors in traditional generating unit's generators and turbines. This is not entirely true, however, as new generating units begin to employ techniques such as synthetic inertia and energy storage systems. The presented measurement equipment is able to quantify the contribution to frequency stability provided by a generating unit without knowledge of the generating unit's converter technology, control techniques or parameters.

One embodiment of the invention is based on an equipment to be installed between a generating unit and an electric power system, as shown in FIG. 2. It emulates an electric power system undergoing a power unbalance, which manifests itself through a grid frequency swing. This equipment consists of a back-to-back converter whose grid side controls its DC link voltage, while the generating unit side generates three-phase, rated amplitude voltages whose frequency is given by a Load Frequency Control (LFC) model.

The frequency stability issue is dealt with through Load-Frequency Control (LFC). LFC's objective is to regulate system frequency and tie-line power flows despite disturbances caused by unbalances between generated and consumed power. The model for LFC studies developed by KUNDUR, P., BALU, N. J., LAUBY, M. G. Power system stability and control, v. 7. New York, McGraw-hill New York, 1994 will be used to assess time responses by generation units connected to an EPS. Classical hydroelectric plant governor and turbine models from the same reference are employed.

The feature to be studied more closely is the frequency nadir. Primary frequency control is more critical to frequency nadir, as it is the fastest control to act on mechanical power input. It reestablishes power balance, stopping frequency deviation, but it allows a steady-state frequency error. Secondary frequency control, responsible for reestablishing reference values for system frequency and tie-line power flows, has a slower response, with little influence on these variables, and will not be modelled.

A generator with a mismatch between delivered mechanical torque $T_m(t)$ and exerted electrical torque $T_e(t)$, whose rotor has an inertia J and spins at a mechanical angular speed $\omega_r(t)$, experiences a rotor acceleration described by equation (1.1).

$$T_{m(t)} - T_{e(t)} = J \frac{d\omega_r(t)}{dt} \quad (1.1)$$

If it is desired to work in a per unit system, one may define the inertia constant $$H = \frac{E}{P_{base}} = 0.5 J \omega_{base}^2 / P_{base},$$

where $P_{base}$ is a base power and $\omega_{base}$ is a base mechanical angular speed, typically taken as the machine's rated values, and rewrite equation (1.1) as equation (1.2), where overbars denote a variable in the per unit base system. The index r for angular speed is dropped, as mechanical and electrical angular speeds are equal in a per unit system.

$$\overline{T}_m(t) - \overline{T}_e(t) = 2H \frac{d\overline{\omega}(t)}{dt} \quad (1.2)$$

Expressing equation (1.2) in terms of small deviations around a stable equilibrium at t=0 is given by set of equations (1.3), where $T_m(0)=T_e(0)$ and $\overline{\omega}(0)=\overline{\omega}_{base}=1$, gives equation (1.4).

$$\Delta \overline{T}_m(t) = \overline{T}_m(t) - \overline{T}_m(0) \qquad (1.3)$$
$$\Delta \overline{T}_e(t) = \overline{T}_e(t) - \overline{T}_e(0)$$
$$\Delta \overline{\omega}(t) = \overline{\omega}(t) - \overline{\omega}(0)$$

$$\Delta \overline{T}_m(t) - \Delta \overline{T}_e(t) = 2H \frac{d\Delta\overline{\omega}(t)}{dt} \qquad (1.4)$$

The per unit power being delivered associated with a torque is given by equation (1.5) and can be likewise expanded in terms of small deviations, which gives equation (1.6).

$$\overline{p}(t) = \overline{\omega}(t)\overline{T}(t) \qquad (1.5)$$

$$\Delta\overline{p}(t) + \overline{p}(0) = [\Delta\overline{\omega}(t) + \overline{\omega}(0)][\Delta\overline{T}(t) + \overline{T}(0)] \qquad (1.6)$$

Terms composed only of initial values cancel out. Neglecting second order deviation terms gives equation (1.7).

$$\Delta\overline{p}(t) = \overline{T}(0)\Delta\overline{\omega}(t) + \overline{\omega}(0)\Delta\overline{T}(t) \qquad (1.7)$$

Calculating the power deficit (subtracting electrical power from mechanical power) and applying equation (1.7) results in equation (1.8).

$$\Delta\overline{p}_m(t) - \Delta\overline{p}_e(t) = [\overline{T}_m(0) - \overline{T}_e(0)]\Delta\overline{\omega}(t) + \overline{\omega}(0)[\Delta\overline{T}_m(t) - \Delta\overline{T}_e(t)] \qquad (1.8)$$

Starting from equilibrium, at rated speed, $T_m(0)=T_e(0)$ and $\omega(0)=1$, which results in equation (1.9).

$$\Delta\overline{p}_m(t) - \Delta\overline{p}_e(t) = \Delta\overline{T}_m(t) - \Delta\overline{T}_e(t) \qquad (1.9)$$

Therefore, equation (1.4) can be rewritten with respect to powers instead of torques, as in (1.10).

$$\Delta\overline{p}_m(t) - \Delta\overline{p}_e(t) = 2H\frac{d\Delta\overline{\omega}(t)}{dt} \qquad (1.10)$$

The electric power can be expressed in two separate terms to account for load variation with frequency. Equation (1.11) does so, with D being the load's damping constant. A typical value considered for D is 1 (see UCTE Operation Handbook Appendix 1: Load-Frequency Control and Performance. UCTE, June 2004 and KUNDUR, P., BALU, N. J., LAUBY, M. G. Power system stability and control, v. 7. New York, McGraw-hill New York, 1994), meaning a frequency deviation will cause an equal load variation in a per unit system.

$$\Delta\overline{p}_e(t) = \Delta\overline{p}_L(t) + D\Delta\overline{\omega}(t) \qquad (1.11)$$

Substituting in equation (1.10) gives $$\Delta\overline{p}_m(t) - \Delta\overline{p}_L - D\Delta\overline{\omega}(t) = 2H\frac{d\Delta\overline{\omega}(t)}{dt} \qquad (1.12)$$

Primary frequency control drives change in gate position y(t) to change input mechanical power through a speed governor. It may be implemented with mechanical-hydraulic or electrohydraulic systems, analog or digital. For hydraulic plants, a transient droop RT is used to increase stability margins, needed to enable the typical permanent droop of $R_P$=5%. The reset time constant for the transient droop is $T_R$. A simplified representation of the hydraulic turbine governor (see KUNDUR, P., BALU, N. J., LAUBY, M. G. Power system stability and control, v. 7. New York, McGraw-hill New York, 1994), considering a governor actuator characterized by a time constant $T_G$, is given by the transfer function from frequency deviation to change in gate position in equation (1.13).

$$\frac{\Delta \overline{Y}(s)}{\Delta \overline{\Omega}(s)} = -\frac{1}{R_P}\left(\frac{1}{1+sT_G}\right)\left(\frac{1+sT_R}{1+s\left(\frac{R_T}{R_P}\right)T_R}\right) \qquad (1.13)$$

Finally, the classical, lossless transfer function for the hydraulic turbine relates gate position change and output mechanical power, as given by equation (1.14). The parameter $T_W$ varies with turbine loading, typically ranging from 0.5 to 4 s at full load, and is called water starting time.

$$\frac{\Delta \overline{P}_m(s)}{\Delta \overline{Y}(s)} = \frac{1-sT_W}{1+\frac{1}{2}sT_W} \qquad (1.14)$$

Equations (1.13) and (1.14) assume a per unit system with bases given by variables' steady-state, pre-disturbance values.

The model is graphically summarized by the block diagram in FIG. 3, which additionally includes a power input $\Delta \overline{P}_{feg}$ from the generating unit under test. It can be regarded as a single area model of an EPS, neglecting speed deviations between generators within this area. That is, it represents the power balance within an isolated control area (no tie line power flow to other control areas), except for the connection to the generating unit under test, of an EPS and a collective rotor speed among the generators in that control area.

In order to have the measurement unit behave as a three-phase voltage source whose frequency is given by a hydraulic turbine and governor load-frequency control model, the model must be translated into a set of difference equations to be computed periodically by the microcontroller. This process is called discretization, i.e., the representation of a continuous-time dynamic system by a discrete-time dynamic system.

This method assumes the system's input signals change in regularly-spaced steps, i.e., changes happen at a constant frequency and the input signals are held constant between changes, and the system's output signals are evaluated or measured at the same constant frequency, at the same time input signals change. In other words, the system's input signals are continuous in time, but constant between the measurements of the system's output signals. The interval between measurements of the system's outputs is called the system's sampling period. If such an assumption is true, then the zero-order hold discretization method gives an exact representation of the system's inputs and outputs at the sampling instants in time, see ÅSTRÖM, K., WITTENMARK, B. Computer-Controlled Systems: Theory and Design. Dover Books on Electrical Engineering. 3 ed. New Jersey, N.J., Prentice Hall, 1997. Available at: <https://books.google.com.br/books?id=TynEAgAAQBAJ>.

For a system described by the state space equations (2.1), zero-order hold yields the new system of state space equations (2.2). It describes the same dynamic system, but at instants in time $t_k$=kh, for an integer k, separated by a constant sampling period h.

$$\dot{x}(t) = Ax(t) + Bu(t)$$

$$\dot{y}(t) = Cx(t) + Du(t) \qquad (2.1)$$

$$x(kh+h)=e^{Ah}x(kh)+\int_0^h e^{As}dsBu(kh)$$

$$y(kh)=Cx(kh)+Du(kh) \tag{2.2}$$

Using such a discretization method for the hydraulic turbine and governor model would be an approximation, as its input signal, the generating unit to be tested's output power, is not guaranteed to be constant between sampling intervals. Furthermore, the original system's continuously-varying frequency output is evaluated at the same, constant, rate and used as the converter's three-phase voltage source frequency. I.e., the output frequency is also approximated to a staircase function.

The discretization sampling frequency is the frequency at which the microcontroller periodically measures inputs and calculates its outputs. The discretized model was calculated initially with the same sampling frequency as the converter's digital control system, 5100 Hz.

Testing the implemented difference equation algorithm through a testing routine in a computer showed over 10% difference at some points from the continuous transfer function's response. Increasing past inputs and past outputs variables' floating-point precision reduced the error, but it was still significant.

Different simulation methods give very different results for this discrete transfer function, the time response does not converge among the different methods. The adopted solution was to use downsampling to implement the difference equation. The system's embedded simulation could also have been implemented as a recursive calculation of the discrete state space equation, without needing to resort to downsampling, but at higher computational cost.

The solution to the discretized model stability was to downsample the model, only calculating its response for every n calls to the microprocessor's interruption routine. A choice of n=10, leading to the transfer function in equation (2.3) at a 510 Hz sampling frequency, was sufficient to achieve a stable system and yet, fast enough to be able to respond to the expected power signals.

$$H(z) = \frac{0.0003267z^3 - 0.0009758z^2 + 0.0009713z - 0.0003223}{z^4 - 3.986z^3 + 5.958z^2 - 3.958z + 0.986} \tag{2.3}$$

With this discretization, implemented by difference equation (2.4), all simulation methods yielded the same results.

$$\omega_k=0.0003267p_{k-1}-0.0009758p_{k-2}+0.0009713p_{k-3}-0.0003223p_{k-4}+3.986\omega_{k-1}-5.958\omega_{k-2}+3.958\omega_{k-3}-0.986\omega_{k-4} \tag{2.4}$$

It was found on computer-based testing routines that using a more precise representation, 64-bit floating point, for the difference equation coefficients was required to correctly emulate this turbine and governor model.

Once both converters are connected and operating, testing is simple, as described by Converter 2's state machine diagram in FIG. 4. The converter is initially in standby mode and operates as a three-phase, symmetrical, constant frequency, voltage source.

If a command is given to begin the test routine, the converter changes into a testing state. It then resets the hydraulic turbine and governor transfer function, setting all its past outputs and past inputs variables to zero, records the present real power being absorbed by the converter, resets the test's time counter, which expires after 20 s, and resets the maximum frequency deviation record. A step is applied to the turbine and governor model, emulating a step change in the sum of powers in the systems, such as a load.

If the stop command is given or 20 s pass from the beginning of the test, the converter goes into a recovery state, where it takes the output frequency in a ramp back to 60 Hz in two seconds. After it reaches 60 Hz, the converter goes back to standby.

The minimum frequency reached during a test is a measure of the contribution of the connected generating unit to grid frequency stability. It may be compared with the minimum frequency reached for when no generating units are connected to the measurement unit's terminals.

While the forgoing written description of the invention enables one of ordinary skill to make and use what is considered presently to be the best mode thereof, those of ordinary skill will understand and appreciate the existence of variations, combinations, and equivalents of the specific embodiments herein. Nevertheless, it can be understood that various modifications may be made without departing from the spirit and scope of the invention. Accordingly, other embodiments are within the scope of the following claims.

What is claimed is:

1. An equipment for measurement of a contribution to frequency stability by a generating unit; wherein said equipment is installed between the generating unit and an electric power system so that said equipment emulates the electric power system undergoing a power imbalance, the power imbalance manifesting through a grid frequency swing.

2. An equipment for measurement of a contribution to frequency stability by a generating unit; said equipment comprising a back-to-back converter having a grid side controlling a DC link voltage, and a generating unit side generating a three-phase, rated amplitude voltage; wherein a frequency is given by a Load Frequency Control (LFC) model.

3. A method for measurement of a contribution to frequency stability by a generating unit, comprising installing equipment between the generating unit and an electric power system so that the equipment emulates the electric power system undergoing a power imbalance, wherein the power imbalance manifests through a grid frequency swing.

* * * * *